(12) United States Patent
Potluri

(10) Patent No.: US 8,410,772 B1
(45) Date of Patent: Apr. 2, 2013

(54) BIAS CIRCUIT GENERATING BIAS FROM SUPPLY AND THRESHOLD VOLTAGES

(75) Inventor: Krishna Chaitanya Potluri, Dublin (IE)

(73) Assignee: Xilinx, Inc., San Jose, CA (US)

(*) Notice: Subject to any disclaimer, the term of this patent is extended or adjusted under 35 U.S.C. 154(b) by 323 days.

(21) Appl. No.: 12/955,371

(22) Filed: Nov. 29, 2010

(51) Int. Cl.
  *G01R 19/30* (2006.01)
(52) U.S. Cl. ............ 324/103 R; 327/539; 323/313
(58) Field of Classification Search .......... None
  See application file for complete search history.

(56) References Cited

U.S. PATENT DOCUMENTS 7,486,082 B2 * 2/2009 Hachisuka et al. ......... 324/536
7,741,828 B2 * 6/2010 Wittman ................. 324/76.11

* cited by examiner

*Primary Examiner* — Melissa Koval
*Assistant Examiner* — Trung Nguyen
(74) *Attorney, Agent, or Firm* — LeRoy D. Maunu

(57) ABSTRACT

A bias circuit generates a bias voltage. The bias circuit includes a first, a second, and a third detection circuit and a summing circuit. The first detection circuit generates a first characterization voltage that represents a variation of a power supply voltage from a nominal voltage. The first characterization voltage increases as the power supply voltage decreases and the first characterization voltage decreases as the power supply voltage increases. The second detection circuit generates a second characterization voltage that represents a threshold voltage of one or more p-type transistors. The third detection circuit generates a third characterization voltage that represents a threshold voltage of one or more n-type transistors. The summing circuit generates the bias voltage that is the power supply voltage reduced by a weighted sum of the first, second, and third characterization voltages.

20 Claims, 4 Drawing Sheets

BIAS CIRCUIT GENERATING BIAS FROM SUPPLY AND THRESHOLD VOLTAGES

FIELD OF THE INVENTION

One or more embodiments generally relate to biasing to compensate for variations of process, voltage, and temperature (PVT), and more particularly to PVT compensation of output drivers in an integrated circuit.

BACKGROUND

The transistors in an integrated circuit have operating characteristics that vary with PVT variations. For example, the gate oxide might be fabricated thinner than specified and over etching of the gate polysilicon might produce a channel length shorter than specified. A CMOS inverter generally has increasing drive strength as its transistors have thinner gate oxides and shorter channels, as the power supply voltage increases, and as the operating temperature decreases. Thus, a combination of PVT variations might increase the drive strength of a CMOS inverter. Furthermore, certain PVT variations might affect the PMOS pull-up of a CMOS inverter differently than the NMOS pull-down of the CMOS inverter. Thus, certain PVT variations create a mismatch between the driving strength of the PMOS pull-up and the NMOS pull-down of the CMOS inverter. The mismatched driving strengths create a mismatch between the edge rates of the rising and falling transitions at the output signal of the CMOS inverter, and these mismatched transitions distort the duty cycle of the output signal. In addition, the allowable edge rates of the rising and falling transitions may be limited to prevent excitation of a high-frequency resonance at the output signal. However, it may be difficult to achieve the desired edge rates for both rising and falling transitions across the possible range of PVT variations, or an excessive limit on the edge rates might be required to meet the allowable edge rates across the possible range of PVT variations.

The internal circuitry of integrated circuits is powered by a power supply voltage that generally decreases as feature sizes become smaller in successive fabrication technologies. However, the signaling standards between integrated circuits continue to maintain backwards compatibility as feature sizes become smaller. A prevalent signaling standard has levels of 3.3 volts and zero volts. CMOS circuitry can provide this signaling standard from a 3.3 volt power supply because CMOS drives from rail-to-rail. This signaling standard is prevalent because it is backwards compatible with TTL logic levels powered from a 5 volt power supply. Thus, even though internal circuitry is powered with 1 volt or less in the current fabrication technologies, the signaling standards between integrated circuits continue to maintain backwards compatibility with an obsolete fabrication technology based on a 5 volt power supply.

The scaling of feature sizes in successive fabrication technologies includes progressively thinner gate oxides for the transistors. The thin gate oxide of current fabrication technologies cannot reliably withstand the 3.3 volts needed to drive the backwards compatible signaling standard. Thus, some fabrication technologies include a special thick gate oxide for fabricating transistors that reliably tolerate 3.3 volts. The internal circuitry is fabricated from transistors with the thin gate oxide, while the output drivers are fabricated from transistors with the special thick gate oxide.

There is a general need to drive output signals with legacy signaling standards. One or more embodiments may address one or more of the above issues.

SUMMARY

In one embodiment, a bias circuit generates a bias voltage. The bias circuit includes a first, a second, and a third detection circuit and a summing circuit. The first detection circuit generates a first characterization voltage that represents a variation of a power supply voltage from a nominal voltage. The first characterization voltage increases as the power supply voltage decreases and the first characterization voltage decreases as the power supply voltage increases. The second detection circuit generates a second characterization voltage that represents a threshold voltage of one or more p-type transistors. The third detection circuit generates a third characterization voltage that represents a threshold voltage of one or more n-type transistors. The summing circuit generates the bias voltage, which is the power supply voltage reduced by a weighted sum of the first, second, and third characterization voltages.

In another embodiment, an output driver is compensated for process, voltage, and temperature variations. The output driver includes a first, a second, and a third detection circuit, a summing circuit, and a driver circuit. The first detection circuit generates a first characterization voltage that represents a variation of a power supply voltage from a nominal voltage. The second detection circuit generates a second characterization voltage that represents a threshold voltage of one or more p-type transistors. The third detection circuit generates a third characterization voltage that represents a threshold voltage of one or more n-type transistors. The summing circuit generates the bias voltage, which is the power supply voltage reduced by a weighted sum of the first, second, and third characterization voltages. The driver circuit includes two or more p-type transistors coupled in series. These p-type transistors drive an output signal to the power supply voltage when the bias voltage is applied to the gates of these p-type transistors.

A bias circuit, in another embodiment, includes a first, a second, and a third detection circuit and a summing circuit. The first detection circuit generates a first characterization voltage from a first, a second, and a third n-type transistor coupled in series between a power supply signal and ground. The power supply signal is coupled to a gate of the first n-type transistor. A first fraction of a power supply voltage of the power supply signal is applied to a gate of the second n-type transistor. A second fraction of the power supply voltage is applied to a gate of the third n-type transistor. The second detection circuit generates a second characterization voltage from a first p-type transistor and one or more second p-type transistors coupled in series between an auxiliary power supply signal and ground. The auxiliary power supply signal is coupled to a gate of the first p-type transistor. Each of the second p-type transistors is diode connected. The third detection circuit generates a third characterization voltage from a third p-type transistor and one or more fourth n-type transistors coupled in series between the auxiliary power supply signal and ground. The auxiliary power supply signal is coupled to a gate of the third p-type transistor. Each of the fourth n-type transistors is diode connected. The summing circuit generates the bias voltage from a fifth and a sixth n-type transistor and a parallel combination coupled in series between the power supply signal and ground. The power supply signal is coupled to a gate of the fifth transistor. The second fraction of the power supply voltage is applied to a gate of the sixth transistor. The first, second, and third characterization voltages are respectively applied to a respective gate of a seventh, an eighth, and a ninth n-type transistor of the parallel combination.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
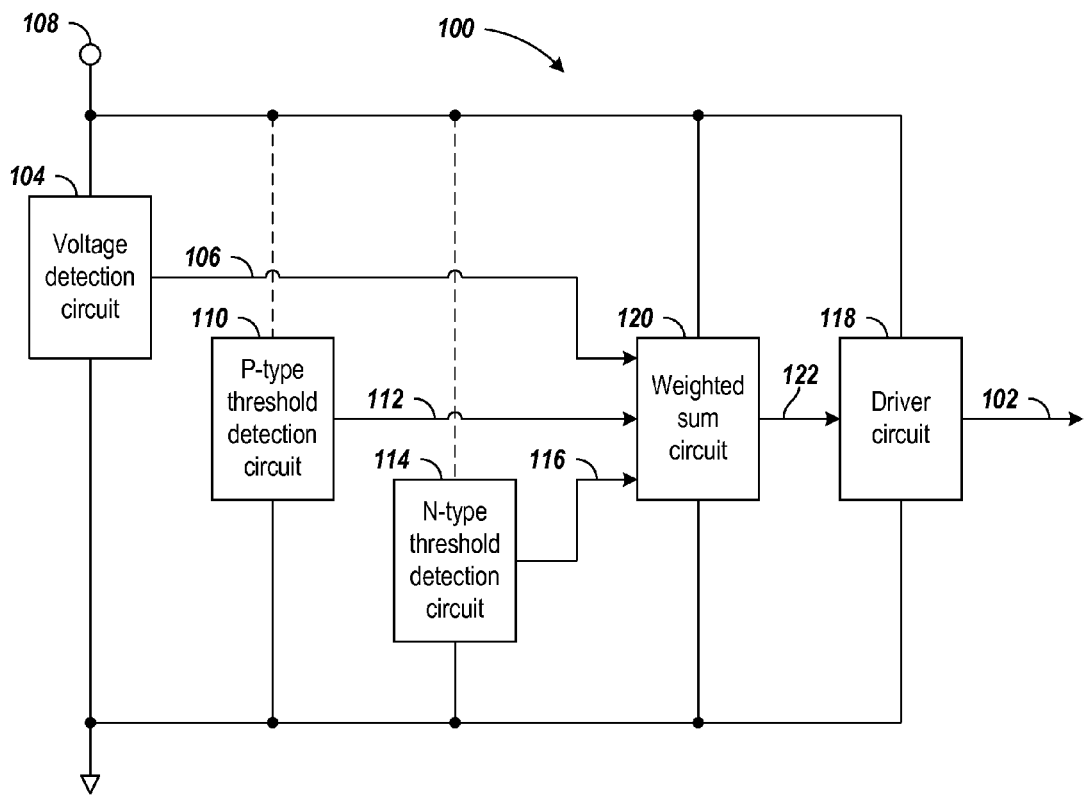
FIG. 1 is a block diagram of output driver compensated for process, voltage, and temperature variation.

FIG. 1 is a block diagram of output driver 100 compensated for process, voltage, and temperature (PVT) variation. Over PVT variations, the output driver 100 matches the edge rates of the rising and falling transitions of the output signal on line 102. The output driver 100 also keeps these edge rates from exceeding a limit on the allowable edge rates over the PVT variations.

The output driver includes a voltage detection circuit 104 configured to generate a characterization voltage on line 106 that represents a variation of a power supply voltage of a power supply signal 108. In one embodiment, the characterization voltage on line 106 increases as the power supply voltage decreases from a nominal voltage, and the characterization voltage decreases as the power supply voltage increases from a nominal voltage. Thus, the voltage detection circuit 104 assesses variation in the power supply voltage of the power supply signal.

The output driver includes a p-type threshold detection circuit 110 configured to generate a second characterization voltage on line 112 that represents a threshold voltage of one or more p-type transistors. While variations in the fabrication process and the operating temperature are difficult to measure directly, deviation of threshold voltages is a primary effect of process and temperature variations. Thus, p-type threshold detection circuit 110 assesses variation of the p-type threshold voltage produced by PVT variations. Similarly, n-type threshold detection circuit 114 generates a third characterization voltage on line 116 that assesses variation of the n-type threshold voltage produced by PVT variations.

In the illustrated embodiment, the same power supply signal 108 powers the detection circuits 104, 110, and 114 and the driver circuit 118. In another embodiment, an auxiliary power supply powers the threshold detection circuits 110 and 114, and the power supply signal 108 powers the voltage detection circuit 104 and the driver circuit 118.

Typically, PVT variations similarly affect similarly constructed transistors in an integrated circuit. Thus, the output driver 100 extrapolates the assessments of variation of the threshold voltages from transistors in threshold detection circuits 110 and 114 to variation of the threshold voltages of transistors in driver circuit 118.

The summing circuit 120 is coupled to the detection circuits 104, 110, and 114. The summing circuit 120 is configured to generate the bias voltage on line 122. The bias voltage on line 122 is the power supply voltage of the power supply signal 108 reduced by a weighted sum of the characterization voltages on lines 106, 112, and 116.

The driver circuit 118 drives the output signal on line 102, and the bias voltage on line 122 compensates the drive strengths of driver circuit 118 for PVT variations.

Figure 2:
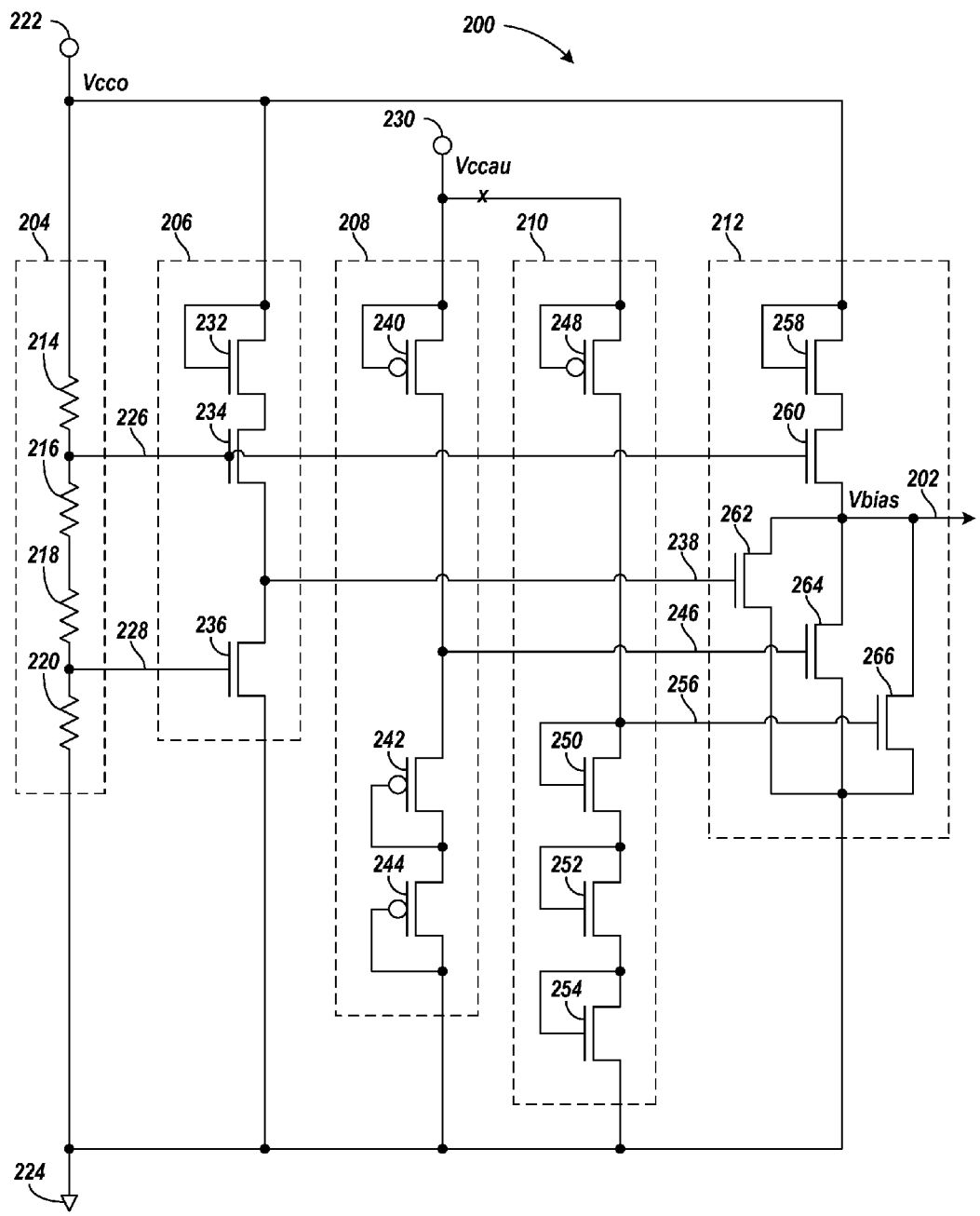
FIG. 2 is a circuit diagram of a bias circuit configured to generate a bias voltage that compensates for process, voltage, and temperature variation.

FIG. 2 is a circuit diagram of a bias circuit 200 configured to generate a bias voltage on line 202 that compensates for PVT variation. The bias circuit 200 includes a voltage divider 204, a voltage detection circuit 206, p-type and n-type threshold detection circuits 208 and 210, and summing circuit 212.

In one embodiment, the voltage divider 204 includes four resistors 214, 216, 218, and 220 that are coupled between a power supply signal 222 and ground 224. While precision resistors are difficult to produce in integrated circuits, the four resistors 214, 216, 218, and 220 have identical constructions to produce matched, but somewhat imprecise resistances. However, the four resistors 214, 216, 218, and 220 precisely divide the power supply voltage of power supply signal 222 because the four resistors 214, 216, 218, and 220 have matched resistances, and because the reference voltages on lines 226 and 228 are connected to transistor gates that provide negligible direct current load. The voltage divider 204 is configured to generate a reference voltage on line 226 that is three-fourths of the power supply voltage of the power supply signal 222. The voltage divider 204 is configured to generate a reference voltage on line 228 that is one-fourth of the power supply voltage of the power supply signal 222. It will be appreciated that bias circuit 200 may be modified to utilize a voltage divider that divides the power supply voltage by other fractions, such as five resistors in series (or two resistors in series with a parallel combination of two resistors) to divide the power supply voltage in fifths.

In one embodiment, the power supply voltage of the power supply signal 222 is a 3.3 volt power supply to support legacy signal standards at the outputs of an integrated circuit. However, the transistors cannot reliably withstand 3.3 volts applied between the gate and the source or drain. If 3.3 volts is applied between the gate and the source or drain of the transistors in the integrated circuit, the gate dielectric quickly fails or eventually fails in certain such transistors, permanently shorting the gate to the channel between the source and drain. This causes destructive failure. Thus, each p-type transistor of the integrated circuit is prone to destructive failure when the 3.3 volt power supply voltage is applied to a source of the p-type transistor and ground is applied to the gate of the p-type transistor. Similarly, each n-type transistor is prone to destructive failure when the 3.3 power supply voltage is applied to the gate of the n-type transistor and ground is applied to the source of the n-type transistor.

In one embodiment, the bias voltage on line 202 is generated to reliably turn on the p-type transistors of output drivers that support legacy signal standards, while also compensating for PVT variations. In this embodiment, the integrated circuit also includes an auxiliary power supply on line 230 providing a drive voltage, such as 2.5 volts, that reliably turns on the n-type transistors of these output drivers. Thus, each p-type transistor is not prone to destructive failure when the 3.3 volt power supply voltage is applied to the source of the p-type transistor and the bias voltage is applied to the gate of the p-type transistor. Similarly, each n-type transistor is not prone to destructive failure when the drive voltage is applied to the respective gate of the n-type transistor and ground is applied to the source of the n-type transistor.

The voltage detection circuit 206 includes three n-type transistors 232, 234, and 236 coupled in series between the power supply signal 222 and ground 224. The n-type transistors 232, 234, and 236 are arranged and sized to generate a characterization voltage on line 238 that represents a variation of the power supply voltage of the power supply signal 222.

The power supply voltage of the power supply signal 222 is applied to a gate of n-type transistor 232, and this makes n-type transistor 232 a diode connected transistor. Thus, the voltage at the node between transistors 232 and 234 drops below the power supply voltage by approximately the saturation voltage of approximately 0.5 volts of the n-type transistor 232; the voltage at the node between transistors 232 and 234 is approximately 2.8 volts. Thus, n-type transistor 232 does not experience voltage differences inducing destructive failure.

Three-fourths of the power supply voltage at the reference voltage on line 226 or about 2.5 volts is applied to a gate of n-type transistor 234. Thus, n-type transistor 232 protects n-type transistor 234 from experiencing a voltage difference between its gate and drain that induces destructive failure. A lower limit on the characterization voltage on line 238 is a saturation voltage of n-type transistor 236, or approximately 0.5 volts. Thus, n-type transistor 234 does not experience a voltage difference between its gate and source that induces destructive failure.

Because three-fourths of the power supply voltage is applied to the gate of n-type transistor 234, an upper limit on the characterization voltage on line 238 is approximately the threshold voltage of 0.2 of n-type transistor 234 below the reference voltage on line 226, or approximately 2.3 volts. This protects n-type transistor 236 and the summing circuit 212 from experiencing voltage differences inducing destructive failure. Thus, n-type transistors 232, 234, and 236 protect each other and the summing circuit 212 from experiencing voltage differences that induce destructive failure.

The reference voltage on line 228 is one-fourth of the power supply voltage of the power supply signal 222. Therefore, the reference voltage on line 228 is approximately 0.8 volt and the reference voltage on line 228 varies in proportion to the variation of the power supply voltage. The reference voltage on line 228 is applied to the gate of n-type transistor 236, and the varying power supply voltage causes a varying reference voltage on line 228 that modulates the current through n-type transistor 236. The varying power supply voltage also acts to modulate the currents through n-type transistors 232 and 234. However, n-type transistor 236 primarily sets the current flowing through the series combination of n-type transistors 232, 234, and 236. The n-type transistor 232 acts primarily as a voltage drop and the n-type transistor 234 acts primarily as a resistance equaling the saturation resistance of n-type transistor 234.

As the power supply voltage of the power supply signal 222 increases, the increasing reference voltage on line 228 increases the current flowing through the series of n-type transistors 232, 234, and 236. This increasing current causes an increasing voltage drop across the saturation resistance of n-type transistor 234, while the voltage drop across the diode-connected n-type transistor 232 is fairly constant. Because the characterization voltage on line 238 is the power supply voltage reduced by the voltage drops across n-type transistors 232 and 234, the characterization voltage between n-type transistors 234 and 236 decreases as the power supply voltage increases. Similarly, the characterization voltage on line 238 increases as the power supply voltage increases from its nominal voltage. Thus, the generated characterization voltage on line 238 represents a variation of the power supply voltage of the power supply signal 222.

The p-type threshold detection circuit 208 includes a p-type transistor 240 and p-type transistors 242 and 244 coupled in series between an auxiliary power supply signal 230 and ground 224. In one embodiment, the auxiliary power supply signal 230 provides a drive voltage of 2.5 volts, and n-type and p-type transistors are not prone to destructive failure when they are powered from this drive voltage. The auxiliary power supply signal 230 is coupled to a gate of p-type transistor 240, turning p-type transistor 240 off. However, leakage current flows through p-type transistor 240 and then through transistors 242 and 244. The diode-connected p-type transistors 242 and 244 turn on enough to conduct the leakage current, resulting in a threshold voltage drop of about 0.4 volts across each p-type transistor 242 and 244. Thus, another characterization voltage is generated on line 246 between p-type transistor 240 and the series combination of p-type transistors 242 and 244, and this characterization voltage on line 246 represents the threshold voltage of p-type transistors 242 and 244. Because PVT variations similarly affect similarly constructed transistors in an integrated circuit, the characterization voltage on line 246 also represents the threshold voltage of p-type transistors similarly constructed to p-type transistors 242 and 244.

The n-type threshold detection circuit 210 includes a p-type transistor 248 and n-type transistors 250, 252, and 254 coupled in series between the auxiliary power supply signal 230 and ground 224. The auxiliary power supply signal 230 is coupled to a gate of p-type transistor 248, producing a leakage current that flows through n-type transistors 250, 252, and 254. The diode-connected n-type transistors 250, 252, and 254 turn on enough to conduct the leakage current, resulting in a threshold voltage drop of about 0.2 volts across each n-type transistor 250, 252, and 254. Thus, a characterization voltage is generated on line 256 between p-type transistor 248 and the series combination of n-type transistors 250, 252, and 254, and this characterization voltage on line 256 represents the threshold voltage of n-type transistors similarly constructed to n-type transistors 250, 252, and 254.

The n-type threshold detection circuit 210 includes three diode-connected n-type transistors 250, 252, and 254, and the p-type threshold detection circuit 208 includes two diode-connected p-type transistors 242 and 244 to balance the difference in threshold voltages between n-type and p-type transistors, and to scale the dependency of the bias voltage of line 202 on the n-type and p-type threshold voltages and the variation of the power supply voltage of the power supply signal 222. It will be appreciated that the number of diode-connected transistors in the threshold detection circuits 208 and 210 may vary.

The summing circuit 212 includes n-type transistors 258 and 260 and the parallel combination of n-type transistors 262, 264, and 266. The n-type transistors 258 and 260 and the parallel combination are coupled in series between the power supply signal 222 and ground 224. The power supply voltage of the power supply signal 222 is applied to a gate of n-type transistor 258, and this makes is n-type transistor 258 diode connected. The reference voltage of three-fourths of the power supply voltage on line 226 is applied to a gate of n-type transistor 260. The characterization voltages on lines 238, 246, and 256 are respectively applied to respective gates of n-type transistors 262, 264, and 266. The bias voltage on line 202 is generated between n-type transistor 260 and the parallel combination of n-type transistors 262, 264, and 266.

The operation of the summing circuit 212 is an extension of the operation of the voltage detection circuit 206. The n-type transistors 258, 260, 262, 264, and 266 protect each other from experiencing voltage differences that induce destructive failure. The load of the bias signal on line 202 is also protected from such voltage differences. The n-type transistor 258 acts primarily as a voltage drop and the n-type transistor 260 acts primarily as a saturation resistance. The characterization voltages on lines 238, 246, and 256 set respective currents flowing through n-type transistors 262, 264, and 266, and the sum of these currents produces a voltage drop across the saturation resistance of n-type transistor 260. Thus, the bias voltage on line 202 is the power supply voltage of the power supply signal 222 reduced by the fairly constant voltage drop of n-type transistor 258 and the voltage drop across the saturation resistance of n-type transistor 260.

The widths of n-type transistors 262, 264, and 266 provide weights that scale the dependency of the current flowing through n-type transistor 260 on the characterization voltages on lines 238, 246, and 256. Thus, the current flowing through n-type transistor 260 and the voltage drop across the saturation resistance of n-type transistor 260 are weighted sums of the characterization voltages on lines 238, 246, and 256. The bias voltage on line 202 is the power supply voltage reduced by the fairly constant voltage drop of n-type transistor 258 and a weighted sum of the characterization voltages on lines 238, 246, and 256.

In one embodiment, the number of diode-connected transistors in threshold detection circuits 208 and 210 and the sizes of the transistors 232, 234, 236, 240, 242, 244, 248, 250, 252, 254, 258, 260, 262, 264, and 266 were determined by trial and error to achieve a bias voltage on line 202 that balances the drive strength of p-type and n-type transistors to compensate for PVT variations. An example PVT variation is varying oxide thickness for p-type and n-type transistor in a fabrication process growing the oxide for p-type transistors independently of growing the oxide for p-type transistors, potentially resulting in mismatched drive strengths between p-type and n-type transistors. In addition, the variation of the drive strength of p-type and n-type transistors is limited across the PVT variations to prevent excitation of parasitic resonances. In this embodiment, the transistors 232, 234, 236, 240, 242, 244, 248, 250, 252, 254, 258, 260, 262, 264, and 266 all have a length of 0.15 microns, and respective widths of 3.0, 1.0, 2.0, 2.0, 2.0, 2.0, 4.0, 1.0, 1.0, 1.0, 8.0, 6.0, 1.5, 3.2, and 4.0 microns. The substrate and/or well connection of the n-type transistors 232, 234, 236, 250, 252, 254, 258, 260, 262, 264, and 266 are connected to ground 224. The substrate and/or well connection of the p-type transistors 240, 242, 244, and 248 are connected to the auxiliary power supply signal 230.

The input signals of the bias circuit 200 are the power supply signal 222, the auxiliary power supply signal 230, and ground 224. Because every path from the power supply signals 222 and 230 and ground 224 to the bias voltage on line 202 is a feed-forward path, every path through the bias circuit 200 is a feed-forward path. Thus, the bias circuit 200 does not include a feedback path. In contrast, existing bias generators generally include an error amplifier that adjusts a bias voltage to narrow a difference between the bias voltage and a reference voltage. This requires a feedback loop including a feedback path from the output of the error amplifier to an input of the error amplifier. Frequently, the bias voltage and the feedback path are routed together between the error amplifier and a load of the bias voltage. This increases the number of noise sensitive signals routed between the bias generator and the load of the bias voltage. Furthermore, the phase delay through this routing can produce high-frequency oscillation of the error amplifier.

In one embodiment, the lack of an error amplifier and the lack of feedback paths simplify the bias generator and the routing of the bias voltage, and prevent unstable oscillation. The simplified bias generator may be duplicated to shorten the distance between the bias generator and its load, reducing the noise induced in the bias voltage. In addition, the bias generator compensates and equalizes the drive strength of p-type and n-type transistors for a variation of a fabrication process for fabricating an integrated circuit including the bias circuit 200, the variation of the power supply voltage of the power supply signal 222, and a variation of an operating temperature of the integrated circuit.

Figure 3:
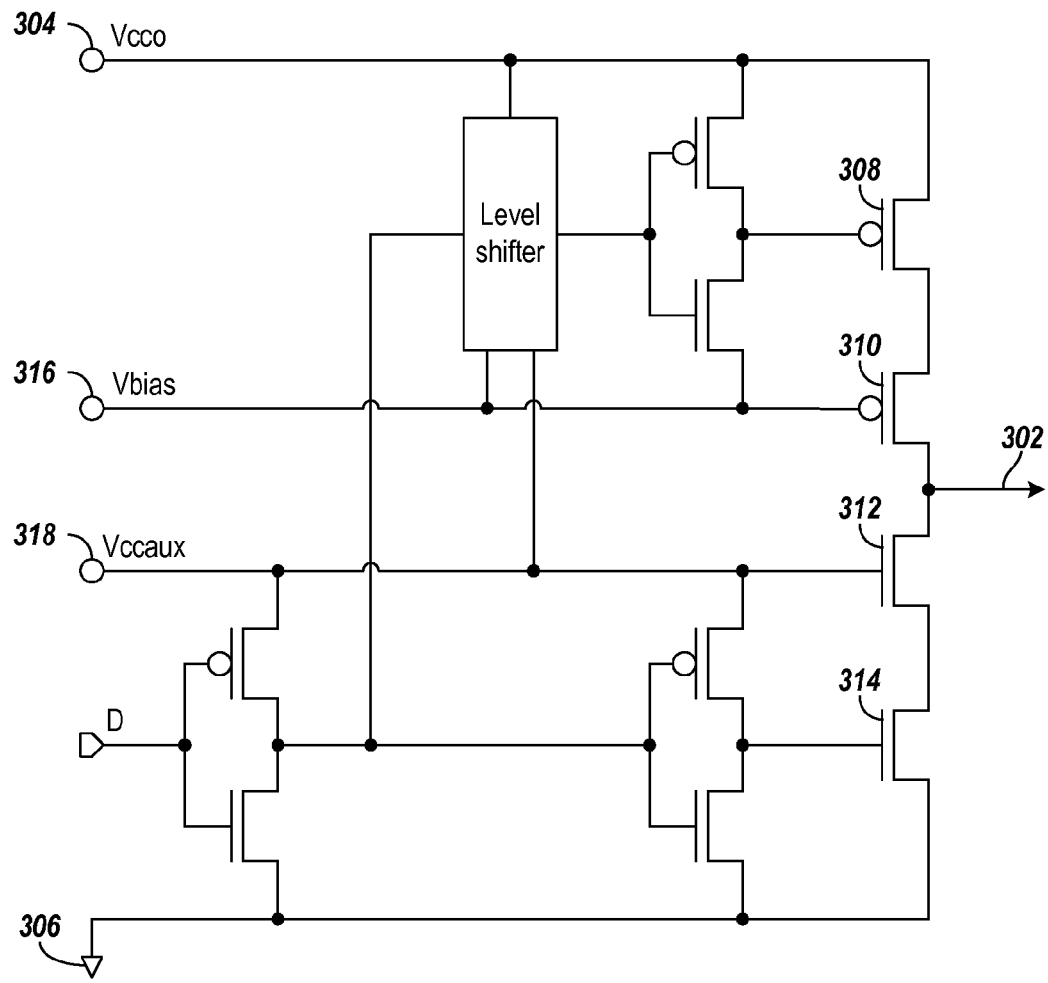
FIG. 3 is a circuit diagram of a driver circuit.

FIG. 3 is a circuit diagram of a driver circuit. The driver circuit drives an output signal on line 302 from rail-to-rail given by the power supply signal 304 and ground 306. However, the p-type drive transistors 308 and 310 and the n-type drive transistors 312 and 314 are unreliable and prone to destructive failure when individually powered from the power supply signal 304 and ground 306. In addition, the drive strength of the drive transistors 308, 310, 312, and 314 varies over PVT variations, causing variation in the rising and falling edges of the output signal on line 302 and distortion of the duty cycle of the output signal on line 302.

The two p-type transistors 308 and 310 are coupled in series between a power supply signal 304 providing the power supply voltage and the output signal on line 302. Correspondingly, the two n-type transistors 312 and 314 are coupled in series between the output signal on line 302 and ground 306. The two series p-type transistors 308 and 310 and the two series n-type transistors 312 and 314 accommodate the power supply signal 304 having a power supply voltage that the individual transistors 308, 310, 312, and 314 cannot withstand reliably. This stacking of the p-type and n-type transistor may be in addition to, or substitute for, a special thick gate oxide for either or both of the p-type and n-type transistors.

The two p-type transistors 308 and 310 drive the output signal on line 302 to the power supply voltage when the bias voltage on line 316 is applied to both gates of the two p-type transistors 308 and 310, and concurrently the two n-type transistors 312 and 314 do not drive the output signal on line 302 when ground is applied to the gate of n-type transistor 314. The two n-type transistors 312 and 314 drive the output signal on line 302 to ground when a drive voltage of auxiliary power supply signal 318 is applied to both gates of the two n-type transistors 312 and 314, and concurrently the two p-type transistors 308 and 310 do not drive the output signal on line 302 when the power supply voltage of power supply signal 304 is applied to the gate of p-type transistor 308.

Each p-type transistor 308 or 310 is individually prone to destructive failure when the power supply voltage of power supply signal 304 is applied to a source of the p-type transistor and ground is applied to the gate of the p-type transistor. Correspondingly, each n-type transistor 312 or 314 is individually prone to destructive failure when the power supply voltage of power supply signal 304 is applied to the gate of the n-type transistor and ground is applied to a source of the n-type transistor. However, each p-type transistor 308 or 310 is not prone to destructive failure when the power supply voltage of power supply signal 304 is applied to the source of the p-type transistor and the bias voltage on line 316 is applied to the gate of the p-type transistor. Similarly, each n-type transistor 312 or 314 is not prone to destructive failure when the drive voltage of auxiliary power supply signal 318 is applied to the gate of the n-type transistor and ground is applied to the source of the n-type transistor.

When the output signal on line 302 is driven to ground 306 by n-type transistors 312 and 314, p-type transistor 308 is actively turned off and p-type transistor 310 turns off while the output voltage of the output signal on line 302 is more than a p-type threshold voltage below the bias voltage on line 316. Thus, while the output voltage of the output signal on line 302 is more than a p-type threshold voltage below the bias voltage on line 316, p-type transistors 308 and 310 conduct a leakage current and form a voltage divider that divides the output voltage of the output signal on line 302. Thus, the power supply voltage of the power supply signal 304 is split across the turned-off p-type transistors 308 and 310, and consequently p-type transistors 308 and 310 do not individually experience a voltage difference that induces destructive failure. Similarly, while n-type transistors 312 and 314 are turned off, they do not experience a voltage difference inducing destructive failure. In summary, the stacked pull-ups transistors 308 and 310 and the stacked pull-down transistors 312 and 314 permit rail-to-rail driving of the output signal on line 302, even though the individual transistors 308, 310, 312, and 314 cannot reliably withstand the rail-to-rail voltage swing of the output signal on line 302.

The two p-type transistors 308 and 310 drive the output signal on line 302 with a rising drive strength when the bias voltage on line 316 is applied to both gates of the two p-type transistors 308 and 310. Similarly, the two n-type transistors 312 and 314 drive the output signal on line 302 at a falling drive strength when the drive voltage of auxiliary power supply signal 318 is applied to both gates of the two n-type transistors 312 and 314. In one embodiment, the bias voltage on line 316 equalizes the rising and falling drive strengths across a variation of a fabrication process for fabricating an integrated circuit including a bias circuit generating the bias voltage on line 316, the variation of the power supply voltage of the power supply signal 304, and a variation of an operating temperature of the integrated circuit. In one embodiment, the bias voltage on line 316 compensates and limits the variation of the rising and falling drive strengths across the PVT variations of a variation of a fabrication process for fabricating an integrated circuit including the bias circuit, the variation of the power supply voltage of the power supply signal 304, and a variation of an operating temperature of the integrated circuit.

Figure 4:
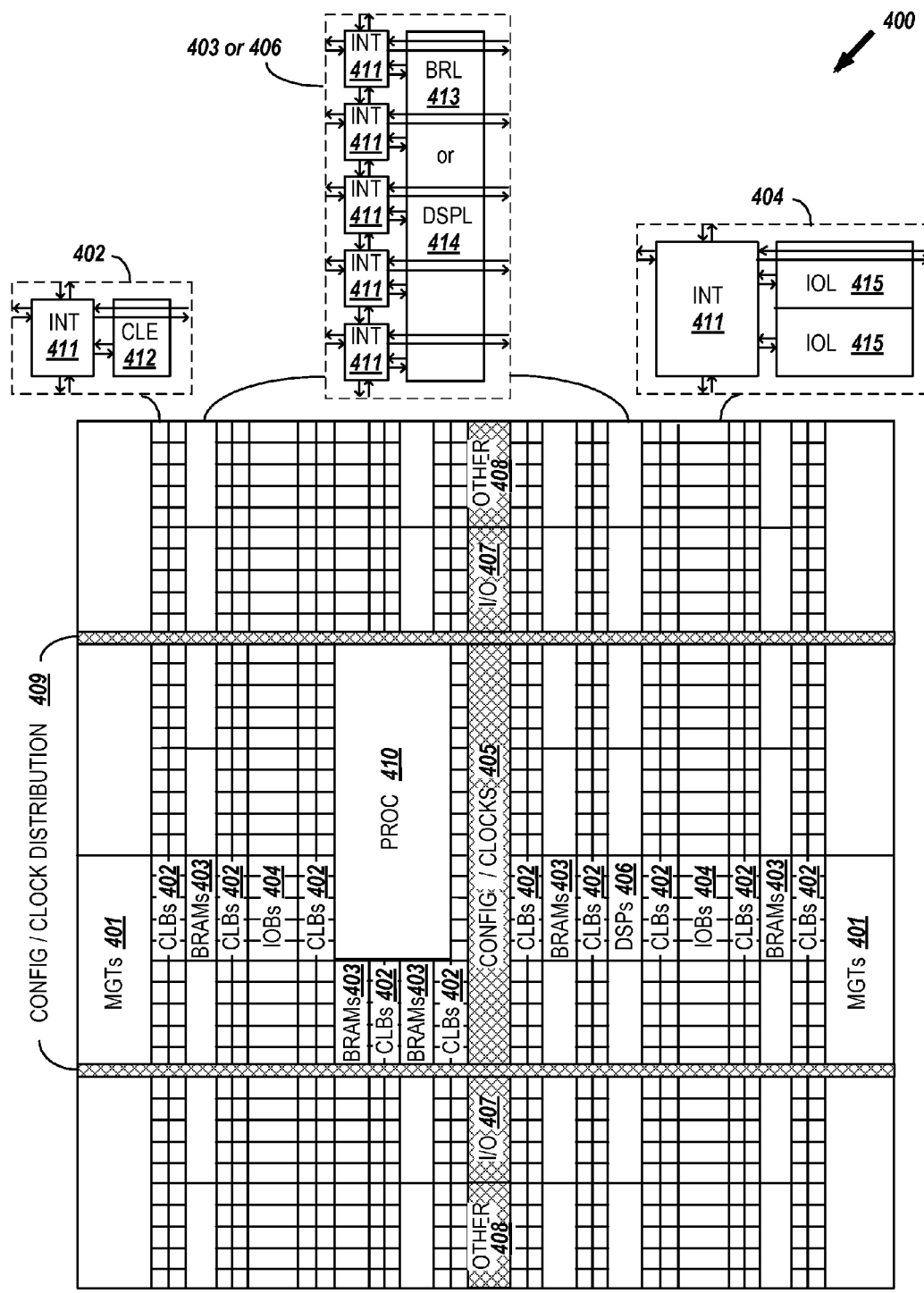
FIG. 4 is a block diagram of an example programmable logic integrated circuit that may implement a bias circuit for each bank of input/output blocks.

FIG. 4 is a block diagram of an example programmable logic integrated circuit that may implement a bias circuit for each bank of input/output blocks (IOBs) 404.

FPGAs can include several different types of programmable logic blocks in the array. For example, FIG. 4 illustrates an FPGA architecture 400 that includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (I/O) 407, for example, e.g., clock ports, and other programmable logic 408 such as digital clock managers, analog to-digital converters, system monitoring logic, and so forth. Some FPGAs also include dedicated processor blocks (PROC) 410 and internal and external reconfiguration ports (not shown).

In one embodiment, the column of IOBs 404 on the left side of FIG. 4 includes one or more banks and the column of IOBs 404 on the right side of FIG. 4 includes one or more banks. Each 10B 404 includes a driver circuit driving a corresponding output signal. Each bank of IOBs 404 has independent power supply pins, permitting the IOBs 404 in different banks to drive different signaling standards, or permitting IOBs 404 in different banks to drive the same signaling standard from independent power supplies. Each such bank includes a bias generator for the IOBs 404 in that bank. The driver circuit of each IOB 404 includes two or more p-type transistors coupled in series and configured to drive the output signal to the power supply voltage when the bias voltage from the local bias generator is applied to the gates of the p-type transistors. The driver circuit of each IOB 404 also includes two or more n-type transistors coupled in series and configured to drive the output signal to ground. The bias voltage from the local bias generator equalizes the rising drive strength of the p-type transistors and the falling drive strength of the n-type transistors across PVT variations, and additionally limits the variation of the rising and falling drive strengths across PVT variations.

FPGAs, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL) 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL) 414 in addition to an appropriate number of programmable interconnect elements. An 10B 404 can include, for example, two instances of an input/output logic element (IOL) 415 in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

One or more embodiments of the present invention are thought to be applicable to a variety of systems for generating a bias voltage. Other aspects and embodiments will be apparent to those skilled in the art from consideration of the specification and practice disclosed herein. The embodiments may be implemented in an application specific integrated circuit (ASIC), or in a programmable logic device. It is intended that the specification and illustrated embodiments be considered as examples only, with a true scope and spirit of the invention being indicated by the following claims.

What is claimed is:

1. A bias circuit that generates a bias voltage, comprising:
a first detection circuit configured to generate a first characterization voltage that represents a variation of a power supply voltage from a nominal voltage, wherein the first characterization voltage increases as the power supply voltage decreases and the first characterization voltage decreases as the power supply voltage increases;
a second detection circuit configured to generate a second characterization voltage that represents a threshold voltage of at least one p-type transistor;
a third detection circuit configured to generate a third characterization voltage that represents a threshold voltage of at least one n-type transistor; and
a summing circuit coupled to the first, second, and third detection circuits and configured to generate the bias voltage, wherein the bias voltage is the power supply voltage reduced by a weighted sum of the first, second, and third characterization voltages.

2. The bias circuit of claim 1, wherein the bias circuit does not include a feedback path.

3. The bias circuit of claim 1, wherein every path through the bias circuit is a feed-forward path.

4. The bias circuit of claim 1, wherein the bias voltage compensates for: a variation of a fabrication process for fabricating an integrated circuit including the bias circuit, the variation of the power supply voltage, and a variation of an operating temperature of the integrated circuit.

5. The bias circuit of claim 1, further comprising an output driver including:
at least one p-type transistor coupled between a power supply signal providing the power supply voltage and an output signal, wherein the at least one p-type transistor drives the output signal to the power supply voltage at a first drive strength in response to the bias voltage being applied to a respective gate of the at least one p-type transistor;
at least one n-type transistor coupled between the output signal and ground, wherein the at least one n-type transistor drives the output signal to ground at a second drive strength in response to a drive voltage being applied to a respective gate of the at least one n-type transistor; and
wherein the bias voltage equalizes the first and second drive strengths across: a variation of a fabrication process for fabricating an integrated circuit including the bias circuit, the variation of the power supply voltage, and a variation of an operating temperature of the integrated circuit.

6. The bias circuit of claim 1, further comprising an output driver including at least two p-type transistors coupled in series between a power supply signal providing the power supply voltage and an output signal, wherein the at least two p-type transistors drive the output signal to the power supply voltage in response to the bias voltage being applied to a respective gate of the at least two p-type transistors.

7. The bias circuit of claim 6, wherein:
the output driver further includes at least two n-type transistors coupled in series between the output signal and ground;
the at least two p-type transistors drive the output signal to the power supply voltage in response to the bias voltage being applied to the respective gate of the at least two p-type transistors, and concurrently the at least two n-type transistors do not drive the output signal in response to ground being applied to a respective gate of one of the at least two n-type transistors; and
the at least two n-type transistors drive the output signal to ground in response to a drive voltage being applied to the respective gate of the at least two n-type transistors, and concurrently the at least two p-type transistors do not drive the output signal in response to the power supply voltage being applied to the respective gate of one of the at least two p-type transistors.

8. The bias circuit of claim 6, wherein the at least two p-type transistors drive the output signal to the power supply voltage at a drive strength in response to the bias voltage being applied to the respective gate of the at least two p-type transistors, and the bias voltage compensates the drive strength for: a variation of a fabrication process for fabricating an integrated circuit including the bias circuit, the variation of the power supply voltage, and a variation of an operating temperature of the integrated circuit.

9. The bias circuit of claim 8, wherein:
each p-type transistor of the at least two p-type transistors is prone to destructive failure in response to the power supply voltage being applied to a respective source of the p-type transistor and ground being applied to the respective gate of the p-type transistor; and
each p-type transistor of the at least two p-type transistors is not prone to destructive failure in response to the power supply voltage being applied to the respective source of the p-type transistor and the bias voltage being applied to the respective gate of the p-type transistor.

10. The bias circuit of claim 7, wherein:
each p-type transistor of the at least two p-type transistors is prone to destructive failure in response to the power supply voltage being applied to a respective source of the p-type transistor and ground being applied to the respective gate of the p-type transistor;
each n-type transistor of the at least two n-type transistors is prone to destructive failure in response to the power supply voltage being applied to the respective gate of the n-type transistor and ground being applied to a respective source of the n-type transistor;
each p-type transistor of the at least two p-type transistors is not prone to destructive failure in response to the power supply voltage being applied to the respective source of the p-type transistor and the bias voltage being applied to the respective gate of the p-type transistor; and
each n-type transistor of the at least two n-type transistors is not prone to destructive failure in response to the drive voltage being applied to the respective gate of the n-type transistor and ground being applied to the respective source of the n-type transistor.

11. The bias circuit of claim 10, wherein:
the at least two p-type transistors drive the output signal at a first drive strength in response to the bias voltage being applied to the respective gate of the at least two p-type transistors;
the at least two n-type transistors drive the output signal to ground at a second drive strength in response to the drive voltage being applied to the respective gate of the at least two n-type transistors; and
the bias voltage equalizes the first and second drive strengths across: a variation of a fabrication process for fabricating an integrated circuit including the bias circuit, the variation of the power supply voltage, and a variation of an operating temperature of the integrated circuit.

12. The bias circuit of claim 1, further comprising a voltage divider coupled between a power supply signal that provides the power supply voltage and ground, the voltage divider configured to generate three-fourths of the power supply voltage and one-fourth of the power supply voltage, wherein:
the first detection circuit includes a first, a second, and a third n-type transistor coupled in series between the power supply signal and ground, the power supply voltage being applied to a gate of the first n-type transistor that is diode connected, the three-fourths of the power supply voltage being applied to a gate of the second n-type transistor, and the one-fourth of the power supply voltage being applied to a gate of the third n-type transistor, wherein the first characterization voltage is generated between the second and third n-type transistors;
the second detection circuit includes a first p-type transistor and the at least one p-type transistor coupled in series between an auxiliary power supply signal and ground, the auxiliary power supply signal coupled to a gate of the first p-type transistor, each of the at least one p-type transistor being diode connected, wherein the second characterization voltage is generated between the first p-type transistor and the at least one p-type transistor;
the third detection circuit includes a second p-type transistor and the at least one n-type transistor coupled in series between the auxiliary power supply signal and ground, the auxiliary power supply signal coupled to a gate of the second p-type transistor, each of the at least one n-type transistor being diode connected, wherein the third characterization voltage is generated between the second p-type transistor and the at least one n-type transistor; and
the summing circuit includes a fourth and a fifth n-type transistor and a parallel combination coupled in series between the power supply signal and ground, the power supply voltage being applied to a gate of the fourth transistor that is diode connected, the three-fourths of the power supply voltage being applied to a gate of the fifth transistor, the first, second, and third characterization voltages being respectively applied to a respective gate of a sixth, a seventh, and an eighth n-type transistor of the parallel combination, wherein the bias voltage is generated between the fifth n-type transistor and the parallel combination.

13. The bias circuit of claim 12, wherein a respective width of the sixth, seventh, and eighth n-type transistors provides respective weights for the weighted sum.

14. An output driver compensated for process, voltage, and temperature variations, comprising:
a first detection circuit configured to generate a first characterization voltage that represents a variation of a power supply voltage from a nominal voltage;
a second detection circuit configured to generate a second characterization voltage that represents a threshold voltage of at least one p-type transistor;
a third detection circuit configured to generate a third characterization voltage that represents a threshold voltage of at least one n-type transistor;
a summing circuit coupled to the first, second, and third detection circuits and configured to generate the bias voltage, wherein the bias voltage is the power supply voltage reduced by a weighted sum of the first, second, and third characterization voltages; and a driver circuit including at least two p-type transistors coupled in series, the at least two p-type transistors configured to drive an output signal to the power supply voltage in response to the bias voltage being applied to a respective gate of each of the at least two p-type transistors.

15. The output driver of claim 14, wherein the output driver does not include a feedback path.

16. The output driver of claim 14, wherein every path through the output driver is a feed-forward path.

17. The output driver of claim 14, wherein:
the at least two p-type transistors drive the output signal at a first drive strength in response to the bias voltage being applied to the respective gate of the at least two p-type transistors;
the driver circuit includes at least two n-type transistors coupled in series, the at least two n-type transistors configured to drive the output signal to ground at a second drive strength in response to a drive voltage being applied to the respective gate of the at least two n-type transistors; and
the bias voltage equalizes the first and second drive strengths across: a variation of a fabrication process for fabricating an integrated circuit including the output driver, the variation of the power supply voltage, and a variation of an operating temperature of the integrated circuit.

18. The output driver of claim 17, wherein:
each p-type transistor of the at least two p-type transistors is prone to destructive failure in response to the power supply voltage being applied to a respective source of the p-type transistor and ground being applied to the respective gate of the p-type transistor; and
each p-type transistor of the at least two p-type transistors is not prone to destructive failure in response to the power supply voltage being applied to the respective source of the p-type transistor and the bias voltage being applied to the respective gate of the p-type transistor.

19. The output driver of claim 14, wherein the driver circuit is one of a plurality of driver circuits that each include at least two p-type transistors coupled in series and configured to drive a respective output signal to the power supply voltage in response to the bias voltage being applied to a respective gate of each of the at least two p-type transistors.

20. A bias circuit that generates a bias voltage, comprising:
a first detection circuit configured to generate a first characterization voltage from a first, a second, and a third n-type transistor coupled in series between a power supply signal and ground, wherein:
the power supply signal is coupled to a gate of the first n-type transistor,
a first fraction of a power supply voltage of the power supply signal is applied to a gate of the second n-type transistor, and
a second fraction of the power supply voltage is applied to a gate of the third n-type transistor;
a second detection circuit configured to generate a second characterization voltage from a first p-type transistor and at least one second p-type transistor coupled in series between an auxiliary power supply signal and ground, wherein:
the auxiliary power supply signal is coupled to a gate of the first p-type transistor, and
each of the at least one second p-type transistor is diode connected;
a third detection circuit configured to generate a third characterization voltage from a third p-type transistor and at least one fourth n-type transistor coupled in series between the auxiliary power supply signal and ground, wherein:
the auxiliary power supply signal is coupled to a gate of the third p-type transistor, and
each of the at least one fourth n-type transistor is diode connected; and
a summing circuit configured to generate the bias voltage from a fifth and a sixth n-type transistor and a parallel combination coupled in series between the power supply signal and ground, wherein:
the power supply signal is coupled to a gate of the fifth transistor,
the second fraction of the power supply voltage is applied to a gate of the sixth transistor, and
the first, second, and third characterization voltages are respectively applied to a respective gate of a seventh, an eighth, and a ninth n-type transistor of the parallel combination.

* * * * *